United States Patent [19]

Schmitz

[11] 4,419,681

[45] Dec. 6, 1983

[54] ZENER DIODE

[75] Inventor: Albert Schmitz, Eindhoven, Netherlands

[73] Assignee: U.S. Philips Corporation, New York, N.Y.

[21] Appl. No.: 188,198

[22] Filed: Sep. 18, 1980

[30] Foreign Application Priority Data

Oct. 18, 1979 [NL] Netherlands ............... 7907680

[51] Int. Cl.³ ............................................. H01L 27/70
[52] U.S. Cl. .......................................... 357/13; 357/20
[58] Field of Search ..................... 357/13, 20, 89, 90, 357/91

[56] References Cited

U.S. PATENT DOCUMENTS 4,104,085 8/1978 Zanfeld .............................. 357/13
4,106,043 8/1978 Culshaw ............................ 357/13

Primary Examiner—Edward J. Wojciechowicz
Attorney, Agent, or Firm—Paul R. Miller

[57] ABSTRACT

A Zener diode having a surface-adjoining first region of a first conductivity type, a second region of the second opposite conductivity type situated within the first region, and a third region of the first conductivity type which is situated at a distance from the surface and which is bounded entirely by the first and the second region and is more highly doped than the first region, the third region being overlapped by the second region on all sides. According to the invention the first region comprises an epitaxial layer which is provided on a more highly doped substrate. The third region is preferably bounded entirely by the second region and by the epitaxial layer. The structure according to the invention provides reproducible breakdown voltages even in the case of series production from semiconductor wafers having a diameter of 76 mm and larger.

10 Claims, 6 Drawing Figures

ZENER DIODE

The invention relates to a semiconductor device with a Zener diode comprising a semiconductor body having a first semiconductor region of a first conductivity type adjoining a surface of the body, a second region of the second opposite conductivity type also adjoining the surface and situated within the first region, and a third region of the first conductivity type bounded by the second region and at least laterally by the first region and being situated at a distance from the surface with a higher doping concentration than at least the laterally surrounding part of the first region, which third region in projection is situated entirely within the second region. The second region forms with the first and the third region a p-n junction which extends substantially parallel to the surface and terminates at the surface.

A semiconductor device with a Zener diode of the kind described is disclosed in U.S. Pat. No. 3,345,221.

Zener diodes are to be understood to mean in this application generally diodes which have a very accurately determined and reproducible breakdown voltage and which are used to obtain a reference voltage. Whether the breakdown is produced by avalanche multiplication or by the "Zener" effect which is the principal mechanism at small breakdown voltages (<6 Volts), is in practice generally of no significance.

A Zener diode of the structure described may be used either as a discrete component or as a component of a monolithic integrated circuit. The important advantage of this structure is that the breakdown occurs at the part of the p-n junction which is present between the second and the third region, as a result of the doping concentrations and doping gradients prevailing there, so that breakdown at the surface is avoided. As a result of this generally an accurately determined breakdown voltage is obtained in a reproducible manner.

In these known Zener diodes there is started from a homogeneously doped substrate in which the third region of the same conductivity type as the substrate and the second region of a conductivity type opposite to that of the substrate are successively formed by doping from outside, either by diffusion or by implantation or by a combination of the two. The sequence of providing the second and the third region may also be reversed, if desired. In this manner of manufacture a large number of semiconductor devices are manufactured simultaneously from one and the same semiconductor wafer.

Applicants have found that in certain circumstances the accuracy and the reproducibility of the breakdown voltage of the diodes described are unsatisfactory. Applicants have recognized that there is a relationship between the accuracy and reproducibility of the breakdown voltage on the one hand, and the size of the semiconductor wafer from which the diodes are manufactured on the other hand. According to whether the starting semiconductor wafer has a larger diameter, the accuracy and the reproducibility of the breakdown voltage decreases.

This is a suprising result since, in view of structure of the Zener diodes described above, it might be expected that the semiconductor wafer from which the substrate is formed has little or no influence on the breakdown voltage. As a matter of fact breakdown does not occur between the second region and the substrate but between the second region and the third region which is more highly doped than the substrate.

It is the object of the invention to provide semiconductor devices with Zener diodes with accurate and reproducible breakdown voltages irrespective of the diameter of the starting semiconductor wafer.

For that purpose a semiconductor device of the kind mentioned in the opening paragraph is characterized according to the invention in that the first region is formed by an epitaxial layer which is provided on a highly doped substrate of the first conductivity type having a higher doping concentration than the epitaxial layer, the epitaxial layer having such a doping and thickness that the differential resistance of the diode is positive also in breakdown.

It has been found that semiconductor devices with Zener diodes having the structure according to the invention which at first sight is unnecessarily complicated, can be manufactured with accurate and reproducible breakdown voltages on even semiconductor wafers having a diameter of 76 mms or larger, That this is the case to a much lesser extent with known structures without an epitaxial layer can presumably be explained as follows. Since the third region in practice is provided in the substrate by doping (implantation and/or diffusion) from outside, the background doping provided by the substrate determines to a considerable extent the doping gradient of the third region at the p-n junction and hence the breakdown voltage. Semiconductor wafers having diameters up to approximately 50 mm can still be manufactured with such a homogeneous doping concentration that the resulting substrates show the required uniformity. When the semiconductor wafers are larger, for example having diameters of 76 mm, this does not prove to be possible any longer so that the diodes manufactured from the same semiconductor wafer show mutual differences in breakdown voltage. In Zener diodes according to the invention, however, the first region is formed by an epitaxial layer the doping of which can be more controlled and can be made much better homogeneous so that the disadvantage is avoided.

Zener diodes in which the homogeneous substrate is replaced by an epitaxial layer on a highly doped substrate sometimes show an irregularity upon breakdown which is probably due to a negative differential resistance as it occurs, for example, also in a so-called "IMPATT" diode, sometimes termed avalanche diode, where this phenomenon is used to generate high-frequency voltages or currents. Of course, this is entirely contradictory to the requirements imposed upon Zener diodes. The phenomenon probably is associated with the occurrence of too large a spreading resistance between the second region and the highly doped substrate. Therefore, as already mentioned, the epitaxial layer must have a thickness and doping such that the differential resistance is always positive even in breakdown.

Although the third region may extend down to the substrate, the third region preferably is bounded entirely by the second region and by the epitaxial layer.

The epitaxial layer advantageously has a thickness of at least 10 $\mu$m and at most 35 $\mu$m, and a resistivity of at least 0.5 Ohm.cm and at most 2 Ohm.cm. Herewith, for example, breakdown voltages between 12 Volts and 120 Volts can be realised in silicon. The resistivity of the highly doped substrate is preferably at most 0.012 OHm.cm in order to obtain a series resistance which is as low as possible.

It is furthermore to be noted that diode structures as described above are known per se for IMPATT diodes and for capacitance diodes. However, these devices differ entirely from those according to the invention and should satisfy requirements which are opposite to requirements imposed upon Zener diodes. For example, in contrast with a Zener diode, an IMPATT diode upon breakdown should have a negative differential resistance, whereas a capacitance diode should preferably have a high breakdown voltage in addition to a certain desired capacitance voltage characteristic, which breakdown voltage, however, need not be accurately determined. For the operation of these devices the field distribution over the epitaxial layer is furthermore of particular importance in contrast with the invention.

The invention will now be described in greater detail with reference to the drawing, in which.

Figure 1:
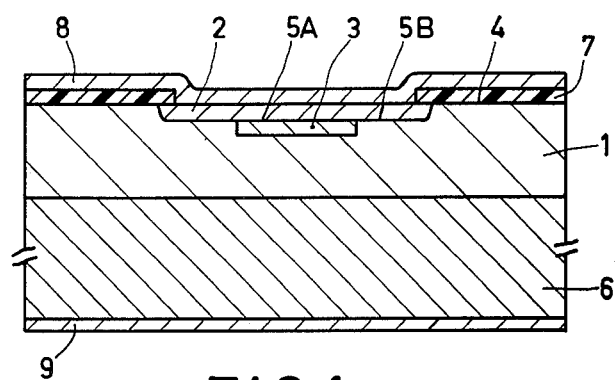
FIG. 1 is a diagrammatic cross-sectional view of a semiconductor device with a Zener diode according to the invention.

For reasons of clarity the figures are diagrammatic and are not drawn to scale, the dimensions, in particular in the direction of thickness, being strongly exaggerated. Semiconductor regions of the same conductivity type are shaded in the same direction; corresponding parts are generally referred to by the same reference numerals in the figures.

FIG. 1 is a diagrammatic cross-sectional view of a discrete Zener diode according to the invention. The diode comprises a semiconductor body having a first semiconductor region 1 of a first conductivity type which in this example in n-type conductive, which first region adjoins a surface 4 of the semiconductor body. Present furthermore is a second region 2 which is situated within the first region, 1 also adjoins the surface 4 and is of the second opposite conductivity type, and in this example is of the p-conductivity type. The device furthermore comprises a third region 3 of the first conductivity type, in this case the n-conductivity type, which has a higher doping concentration than the first region 1, is situated at a distance from the surface 4 and is bounded entirely by the first region 1 and the second region 2. This third region 3 in projection is situated entirely within the second region 2, since the second region 2 overlaps the third region 3 at all sides. The second region 2 forms with the first region 1 and the third region 3 a p-n junction 5 terminating at the surface 4 and extending substantially parallel to the surface. The part of the p-n junction between the second region 2 and the third region 3 is denoted in the figure by 5A; the part between the second region and the first region 1 by 5B. Since the doping concentration of the region 3 is higher than that of the region 1, breakdown of the part 5A of the p-n junction occurs when a sufficiently high voltage is applied in the reverse direction across the p-n junction 5, and not of the part 5B, so that surface breakdown is avoided.

In known Zener diodes of this type the first region 1 is formed by a homogeneous substrate. However, the problems mentioned in the preamble then occur.

According to the invention, however, the first region comprises an epitaxial layer 1 which is provided on a highly doped substrate 6 of the first (n) conductivity type having a higher doping concentration than the first region 1. In this example the third region 3 is surrounded entirely by the second region 2 and by the epitaxial layer 1. The epitaxial layer has such a doping and thickness that the differential resistance of the diode is always positive also upon breakdown. The surface 4 is covered partly by an insulating layer 7; through a window in the insulating layer 7 a contact electrode 8 adjoins the region 2, while on the other side the substrate 6 is contacted by a metal layer 9.

The Zener diode described shows a breakdown voltage which depends on the doping concentrations used and on the diffusion and implantation parameters used during the manufacture. The breakdown voltage of a large number of diodes manufactured simultaneously from the same semiconductor wafer shows very little spreading and is also very readily reproducible when the manufacturing conditions are kept constant.

Figure 4:
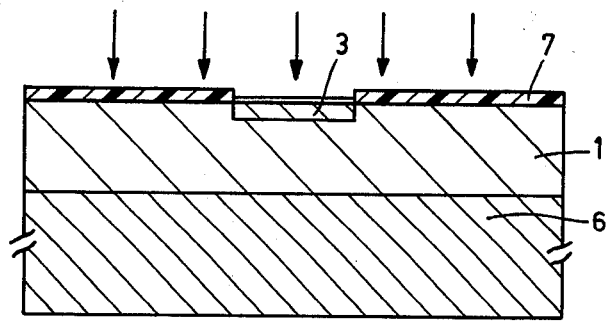
Figure 5:
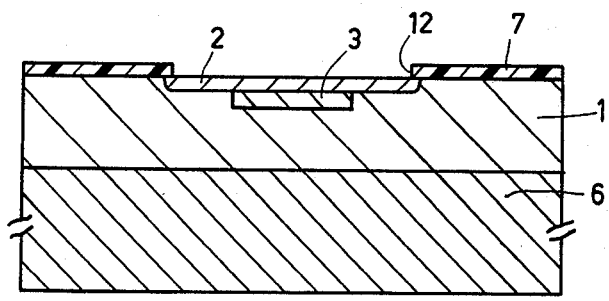

The diode described can be manufactured as follows, see FIGS. 3 to 5. Starting material is a semiconductor wfer 6 of n-type silicon having a diameter of 76 mm, a thickness of 380 $\mu$m and a resistivity of, for example, 0.008 Ohm.cm. On the wafer an n-type conductive silicon layer is grown epitaxially in the usual manner in a thickness of, for example, 30 $\mu$m and a resistivity of 1.5 Ohm.cm. This layer thickness and doping are suitable for diodes having a breakdown voltage of approximately 30 Volts or higher; in general an epitaxial layer having a slightly smaller thickness, for example, 20–25 $\mu$m, and a slightly lower resistivity, for example, 0.6 Ohm.cm, are chosen if breakdown voltages of less than 30 Volts are desired. Only one diode is shown in the figures for clarity, although a large number of diodes are manufactured simultaneously on one single semiconductor wafer.

Figure 2:
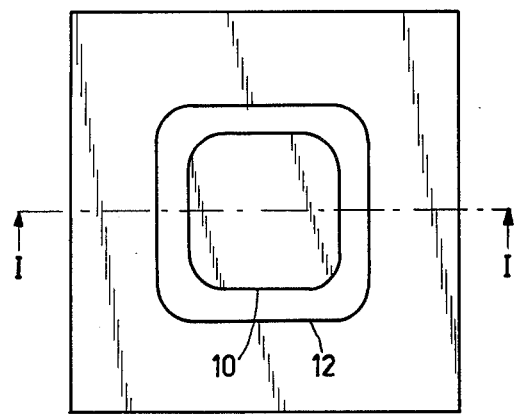
FIG. 2 is a diagrammatic plan view of the device shown in FIG. 1.
Figure 3:
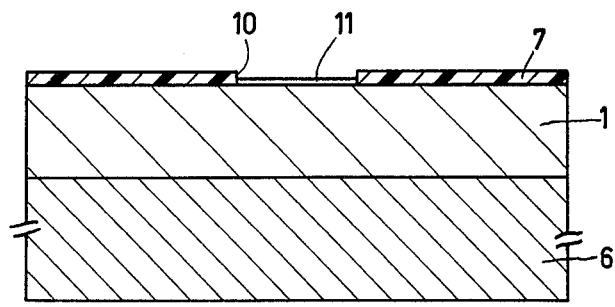
FIGS. 3 to 5 are diagrammatic cross-sectional views of the device in accordance with the invention in successive stages of the manufacture.

A layer 7 of silicon oxide having a thickness of approximately 0.45 $\mu$m, see FIG. 3, is now provided on the surface of the layer 1, for example by thermal oxidation. A window 10 is then etched in said layer 7, for example, a square window having sides of 180 $\mu$m and rounded corners (see plan view of FIG. 2).

A very thin (approximately 0.05 $\mu$m thick) oxide layer 11 is grown in the window. Phosphor ions (see FIG. 4) are then implanted through the thin oxide layer 11 in the silicon region, in which the oxide layer 7 is sufficiently thick to mask against implantation. The energy of the phosphor ions is approximately 70 keV, and the dose is $6 \times 10^{13}$ ions per cm$^2$. The n-type region 3 which is more highly doped than the layer 1 is formed.

After an annealing treatment of approximately 30 minutes at 900° C. in nitrogen, the region 3 is further indiffused for approximately 16 hours at 1200°. A window 12 (see FIG. 5) having sides of approximately 220 $\mu$m is then etched in the oxide layer present on the layer 1; the region 3 is symmetrical within said window, see also FIG. 2.

While using the oxide layer 7 as a mask, boron is then indiffused at a temperature of approximately 1200° C. so as to obtain the p-type region 2. The diffusion is carried out at such a surface concentration that the region 2 becomes fully p-type conductive, the doping of region 3 at the surface being reversed by overdoping. After termination of the processes described, the thickness of region 2 is approximately 2 $\mu$m; the region 3 extends into the body from the surface down to a depth of approximately 4 μm. Finally the thickness of the semiconductor wafer is reduced to approximately 120 μm by grinding and etching and the contact electrodes 8 and 9 are provided. The semiconductor wafer is then severed into separate diodes by scratching and breaking or in a different manner, and the diodes are finished in a usual manner.

The resulting diode had a breakdown voltage of 30 Volts and the breakdown voltages of diodes manufactured on the same semiconductor wafer proved to show only a very small spreading, while the breakdown voltage of other diodes obtained in the same manner were also very readily reproducible. The value of the resulting breakdown voltage, as already stated before, depends on the manufacturing parameters which can be varied at will by those skilled in the art. For example, with the thickness and doping of the epitaxial layer remaining the same and with manufacturing conditions otherwise unvaried, the breakdown voltage can be reduced by increasing the dose of the ions implanted for the formation of the third region 3, and conversely.

Figure 6:
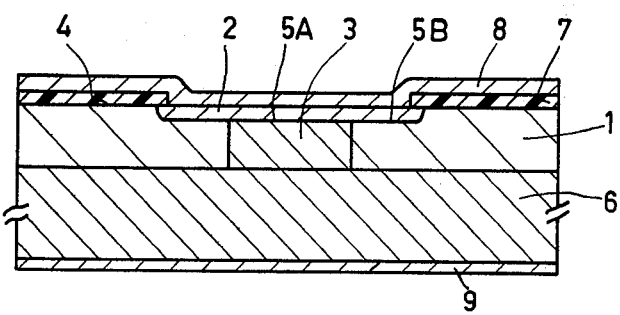
FIG. 6 is a diagrammatic cross-sectional view of another embodiment of the device in accordance with the invention.

The invention is not restricted by the embodiment described. For example, the second region 2 can also be formed by ion implantation instead of by diffusion. Conversely, the region 3 may also be obtained by diffusion. Furthermore the Zener diode may also form part of an integrated circuit. Instead of silicon, germanium or another semiconductor material, for example, an $A_{III}B_V$ compound, may also be used. Finally, it is to be noted that the third region 3 may extend down to the substrate, if desired, as shown in FIG. 6, so that a very low series resistance is obtained.

What is claimed is:

1. A semiconductor device having a Zener diode comprising a semiconductor body having
   a highly doped substrate layer of a first conductivity type,
   a first semiconductor region of an epitaxial layer extending from said substrate layer to a surface of said body and also being of said first conductivity type, said epitaxial layer having a thickness of at least 10 μm and at most 35 μm, and a resistivity of at least 0.5 Ohm cm and at most 2 Ohm cm to provide a positive differential resistance upon breakdown, and said substrate layer having a higher doping concentration than said epitaxial layer,
   a second semiconductor region of a second conductivity type situated within said first semiconductor region, said second semiconductor region also adjoining said surface,
   a third semiconductor region of said first conductivity type disposed at a distance from said surface in said first semiconductor region and bounded by said second semiconductor region, said third semiconductor region having a higher doping concentration than said first semiconductor region, said third semiconductor region in projection being entirely situated within said second semiconductor region, said third semiconductor region containing the depletion zone at breakdown, and said second semiconductor region having a higher doping concentration than said third semiconductor region, and
   a p-n junction between said second semiconductor region and said first and third semiconductor regions and extending substantially parallel to said surface but terminating at said surface.

2. A semiconductor device according to claim 1, wherein said third semiconductor region is surrounded by said first semiconductor region and is covered by said second semiconductor region.

3. A semiconductor device according to claim 2, wherein said third semiconductor region extends through said first semiconductor region from said second semiconductor region to said substrate layer.

4. A semiconductor device according to claim 3, wherein said substrate layer has a resistivity of at most 0.012 Ohm cm.

5. A semiconductor device according to claim 2, wherein said third semiconductor region is bounded entirely by sid epitaxial layer and said second semiconductor region.

6. A semiconductor device according to claim 2, wherein said substrate layer has a resistivity of at most 0.012 Ohm cm.

7. A semiconductor device according to claim 1, wherein said third semiconductor region extends through said first semiconductor region from said second semiconductor region to said substrate layer.

8. A semiconductor device according to claim 7, wherein said substrate layer has a resistivity of at most 0.012 Ohm cm.

9. A semiconductor device according to claim 1, wherein said third semiconductor region is bounded entirely by said epitaxial layer and said second semiconductor region.

10. A semiconductor device according to claim 1, wherein said substrate layer has a resistivity of at most 0.012 Ohm cm.

* * * * *

UNITED STATES PATENT AND TRADEMARK OFFICE
CERTIFICATE OF CORRECTION

PATENT NO. : 4,419,681

DATED : December 6, 1983

INVENTOR(S) : ALBERT SCHMITZ

It is certified that error appears in the above-identified patent and that said Letters Patent is hereby corrected as shown below:

In the claims:

Column 6, line 33
change "sid" to --said--.

Signed and Sealed this

Twenty-second Day of January 1985

[SEAL]

Attest:

DONALD J. QUIGG

Attesting Officer     Acting Commissioner of Patents and Trademarks